US006995471B2

(12) United States Patent
Shue et al.

(10) Patent No.: US 6,995,471 B2
(45) Date of Patent: Feb. 7, 2006

(54) SELF-PASSIVATED COPPER INTERCONNECT STRUCTURE

(75) Inventors: Shau-Lin Shue, Hsinchu (TW); Mong-Song Liang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 10/812,734

(22) Filed: Mar. 30, 2004

(65) Prior Publication Data

US 2004/0180532 A1 Sep. 16, 2004

Related U.S. Application Data

(63) Continuation of application No. 10/207,548, filed on Jul. 29, 2002, now Pat. No. 6,716,753.

(51) Int. Cl.
*H01L 23/48* (2006.01)

(52) U.S. Cl. ...................... 257/758; 257/751; 257/750; 438/687

(58) Field of Classification Search ................ 257/750, 257/751, 758, 762; 438/687, 656
See application file for complete search history.

(56) References Cited

U.S. PATENT DOCUMENTS

| | | | | |
|---|---|---|---|---|
| 5,391,517 | A | 2/1995 | Gelatos et al. | 437/190 |
| 5,714,418 | A | 2/1998 | Bai et al. | 438/627 |
| 5,728,629 | A | 3/1998 | Mizuno et al. | 438/680 |
| 5,913,147 | A | 6/1999 | Dubin et al. | 438/687 |
| 6,046,108 | A | 4/2000 | Liu et al. | 438/687 |
| 6,387,805 | B2 * | 5/2002 | Ding et al. | 438/687 |
| 6,472,231 | B1 * | 10/2002 | Gabriel et al. | 438/9 |
| 6,693,356 | B2 * | 2/2004 | Jiang et al. | 257/767 |

OTHER PUBLICATIONS

Adams et al. “Titanium-nitride self encapsulation of Cu and Ag films on silicon dioxide” (1997) Thin Solid Films pp. 448-454.*

* cited by examiner

*Primary Examiner*—Bradley K. Smith
(74) *Attorney, Agent, or Firm*—Haynes and Boone, LLP

(57) ABSTRACT

An embodiment for a method for forming a self-passivated copper interconnect structure. An insulating layer is formed over a semiconductor structure. An opening is formed in the insulating layer. Next, we form a fill layer comprised of Cu and Ti over insulating layer. In a nitridation step, we nitridize the fill layer to form a self-passivation layer comprised of titanium nitride over the fill layer.

14 Claims, 3 Drawing Sheets

SELF-PASSIVATED COPPER INTERCONNECT STRUCTURE

This is a continuation application of U.S. patent application Ser. No. 10/207,548 filed on Jul. 29, 2002 now U.S. Pat. No. 6,716,753, now allowed.

BACKGROUND OF INVENTION

1) Field of the Invention

This invention relates generally to fabrication of a semiconductor device and more particularly to a method for forming a self-passivated copper damascene structure.

2) Description of the Prior Art

In integrated circuit technology, increased performance (i.e. faster processing) and greater packaging density are continually demanded. A promising approach to increasing performance is the use of copper damascene wiring. By reducing RC delay, copper damascene wiring provides improved performance.

However, as packaging densities of integrated circuits continue to increase, interconnect structures must shrink. To shrink interconnect structures improved step coverage is required. For damascene wiring metal must fill not only trenches, but vias as well. To realize copper damascene wiring, new technologies with excellent step coverage, such as MOCVD and electroplating have been developed. A dielectric barrier layer, such as nitride, has to be put on top of the damascene structure to prevent copper diffusion out of the damascene structure. A nitride barrier layer, because of its high dielectric constant (K-value) will result in high intra-layer capacitance, increasing RC delay.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 5,913,147(Dubin et al.) shows a layer over a Cu alloy plug.

U.S. Pat. No. 5,728,629(Mizuno et al.) shows a passivation process.

U.S. Pat. No. 5,714,418(Bia et al.) discloses a Cu interconnect.

U.S. Pat. No. 5,391,517(Gelatos et al.) discloses a Cu interconnect.

U.S. Pat. No. 6,046,108(Liu et al.) shows a layer over a Cu plug.

SUMMARY OF THE INVENTION

It is an object of an embodiment of the present invention to provide a method for forming a self-passivated copper-damascene structure.

It is another object of an embodiment of the present invention to provide a method for forming a copper damascene structure with reduced RC delay.

It is another object of an embodiment of the present invention to provide a method for forming a copper damascene structure without using inhibitor agents in the CMP slurry used to planarize the copper fill.

It is yet another object of an embodiment of the present invention to provide a method for forming a copper damascene structure that prevents reaction between the copper and subsequent PECVD process steps.

The present invention provides an embodiment a method for forming a self-passivated interconnect structure. An insulating layer is formed over a semiconductor structure. An opening is formed in the insulating layer. Next, we form a fill layer comprised of Cu and Ti over insulating layer. In a nitridation step, we nitridize the fill layer to form a self-passivation layer comprised of titanium nitride over the fill layer.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 6 shows a backscattering spectra for the copper-titanium layer after a 30 minute anneal in $NH_3$ at a temperature of about 400° C.

FIG. 7 shows a backscattering spectra following annealing of a copper-titanium layer in $NH_3$ for 30 minutes at a temperature of about 550° C.

DETAILED DESCRIPTION OF THE INVENTION

The present invention will be described in detail with reference to the accompanying drawings. The present invention provides an embodiment for method for forming a self-passivated copper interconnect structure.

Figure 1:
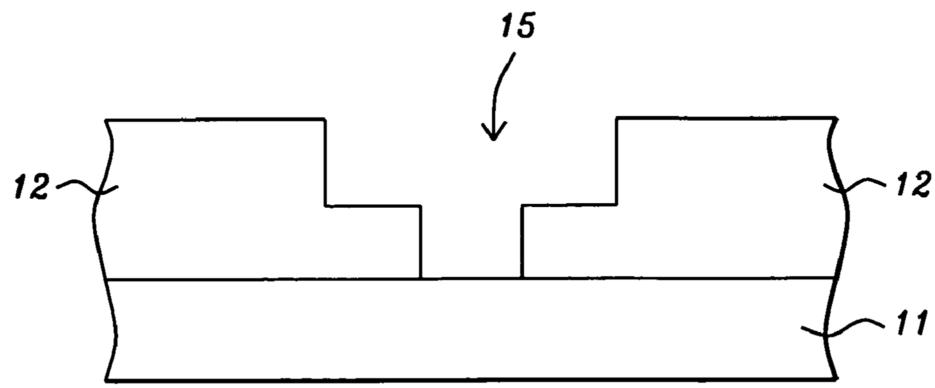
FIG. 1 illustrates a sequential sectional view of a method for forming a self-passivated damascene structure according an embodiment of the present invention.

Referring to FIG. 1, the process begins by forming a opening (e.g., dual damascene pattern) (15) in an insulating layer (12) over a semiconductor structure (11). Semiconductor structure (11) can be understood to comprise a substrate of semiconducting material such as monocrystalline silicon, GaAs, SiGe or a like structure, such as silicon-on-insulator (SOI). Semiconductor structure (11) can be understood to possibly further include one or more conductive and/or insulating layers over the substrate, and one or more active and/or passive devices formed on or over such substrate. Opening (e.g.,. Damascene pattern) (15) can be understood to comprise trenches and/or vias formed in an insulating layer (12) overlying a substrate. Such trenches and vias are typically filled with a conductive material, such as aluminum or copper, to form interconnects for an integrated circuit. The opening (15) can be any shape. The opening (15) can expose underlying conductive lines, elements or device in the semiconductor structure (11).

The insulating layer can be formed of low-k materials with a dielectric constant less than 3.0 or of a oxide or doped oxide. The insulating layer can be an inter metal dielectric (IMD) layer.

Figure 2:
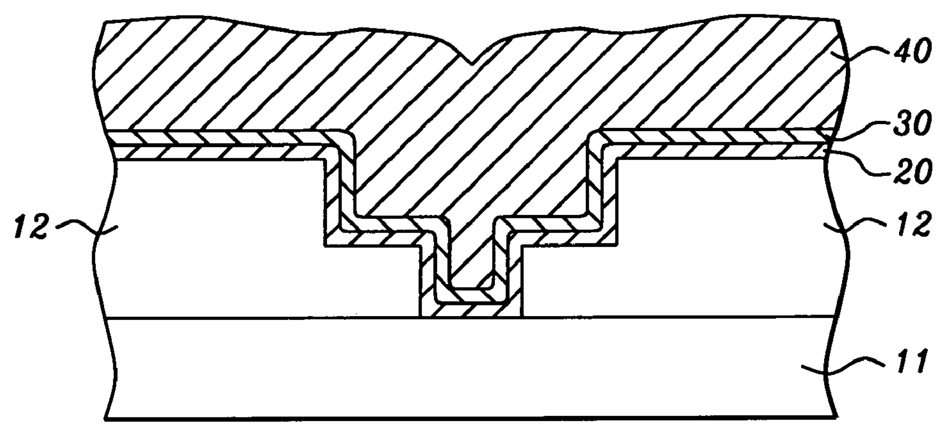
FIG. 2 illustrates a sequential sectional view of a method for forming a self-passivated damascene structure according an embodiment of the present invention.

Referring to FIG. 2, a barrier layer (20) is formed over the semiconductor structure (11), covering the bottoms and sides of the trenches and/or vias in the opening (15) (e.g., dual damascene pattern) (15). The barrier layer (20) is preferably formed on the insulating layer in the opening (15). The barrier layer (20) prevents migration of copper into the insulating layer (12) from subsequently formed copper containing layers. The barrier layer can comprise various metal alloys, including but not limited to tantalum nitride, molybdenum, tungsten, chromium and vanadium; and preferably has a thickness between 50 and 2000 Å.

Still referring to FIG. 2, a seed layer (30) preferably comprised of copper and titanium is formed over the barrier layer (20). The copper-titanium seed layer preferably has a thickness of between about 50 angstroms and 2000 angstroms, and titanium concentration of between about 0.1 and 2.0 weight % . The copper-titanium seed layer can be deposited using a sputtering or plating; and most preferably by a sputtering process using a titanium doped copper target. The target preferably comprises between about 0.1 and 2.0% Ti by weigh.

Next, a copper fill layer (40) is formed over the copper-titanium seed layer (30). The copper fill layer (40) is formed using a process which provides good gap filling properties. The copper fill layer can be deposited using chemical vapor deposition (CVD), plasma-enhanced chemical vapor deposition (PECVD), or most preferably copper electroplating (or ECD). The copper fill layer (40) has a sufficient thickness to completely fill the damascene patterning. The copper fill preferably essentially consists of copper.

Figure 3:
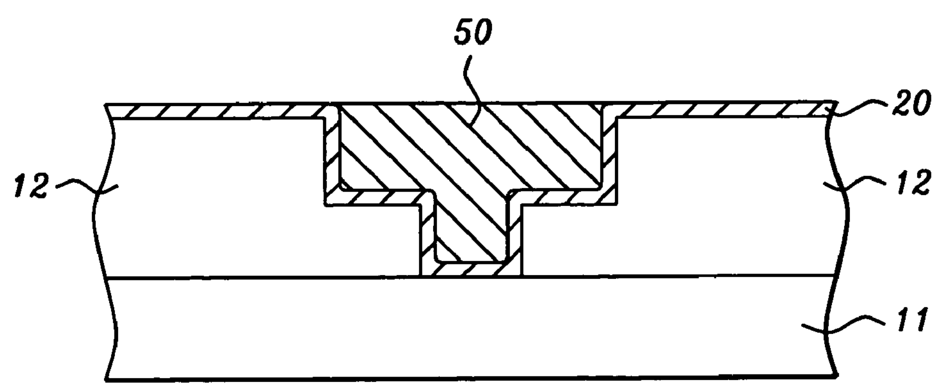
FIG. 3 illustrates a sequential sectional view of a method for forming a self-passivated damascene structure according an embodiment of the present invention.

Referring to FIG. 3, the copper fill layer (40) is preferably planarized. While any of various planarizing processes known in the art can be used, the copper fill layer (40) is preferably planarized using a chemical-mechanical polishing process. Following planarization, the top surface of the copper fill layer (40) is approximately co-planar with the top surface of the adjacent insulating layer (12). An advantage of the embodiment is that an inhibitor agent does not have to be added to the CMP slurry. The seed layer 30 over the insulating layer is preferably removed by the planarization process.

The copper-titanium seed layer (30) and the copper fill layer (40) are preferably annealed following planarization to form a copper-titanium fill layer (50) (e.g., a Copper fill layer that is Ti doped or a Ti doped Cu fill layer). Preferably the annealing step is performed at a temperature between about 150 and 450° C., for a time between about 0.5 and 5 minutes, in an atmosphere of $N_2/H_2$ forming gas. The anneal causes the titanium (Ti) in the Copper-titanium seed layer (30) to migrate or diffuse throughout the copper fill layer (40), thereby forming a copper-titanium fill layer (50). Preferably the Ti is essentially uniformly distributed through the copper-titanium fill layer (50).

The embodiment's copper-titanium fill layer (50) could be formed by other process known by those skilled in the art, such as possibly plating, sputtering or depositing a Cu doped Ti layer without Ti in the seed layer.

Optionally, an over-polish process can be performed after annealing to provide a more planar surface on the copper-titanium fill layer (50).

Figure 4:
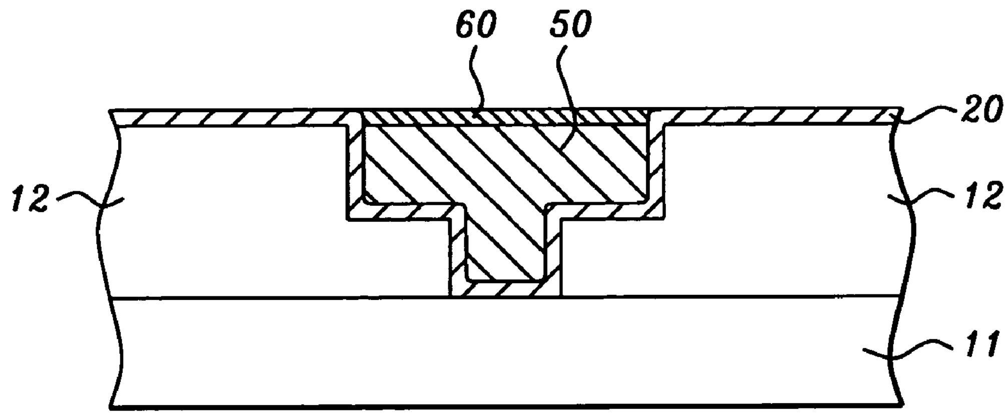
FIG. 4 illustrates a sequential sectional view of a method for forming a self-passivated damascene structure according an embodiment of the present invention.

Referring to FIG. 4, the copper-titanium fill layer (50) is preferably nitridized to form a self-passivation layer (60) over the copper-titanium fill layer (50). The self-passivation layer can be comprised of TiN, oxygen rich TiN (TiN(O)) or TiON or combination thereof. The nitridation step uses the Ti in the fill layer 60 to form a self-passivation layer (60) comprised of titanium nitride.

There are four preferred embodiments for the nitridation process to form the self-passivation layer (60) comprised of titanium nitride.

First, the nitridization can be performed by soaking the semiconductor structure in an $NH_3$ ambient at a temperature of between about 150 C and 450° C. and at a pressure of between about 0.2 torr and 760 torr.

Second, the nitridization can be performed by soaking the semiconductor structure in an $N_2$ and $H_2$ ambient at a temperature of between about 150° C. and 450° C. and at a pressure of between about 0.2 torr and 760 torr.

Third, the nitridization can be performed by exposing the copper-titanium fill layer (50) to an $NH_3$ plasma at a temperature of between about 150° C. and 400° C., at a pressure of between about 0.2 mtorr and 20 mtorr.

Fourth, the nitridation can be performed by exposing the copper-titanium fill layer (50) to an $N_2\backslash H_2$ plasma at a temperature of between about 150° C. and 400° C., at a pressure of between about 0.2 mtorr and 20 mtorr.

An advantage of the present invention is that a high-K nitride barrier layer is not required over the copper fill, reducing RC delay. Another advantage is that an inhibitor agent does not need to be added to the CMP slurry to prevent oxidation of the Cu. Also, the copper in the damascene structure is prevented from reacting with $NH_3/SiH_4$ during subsequent PECVD processes.

EXPERIMENTAL RESULTS

Figure 5:
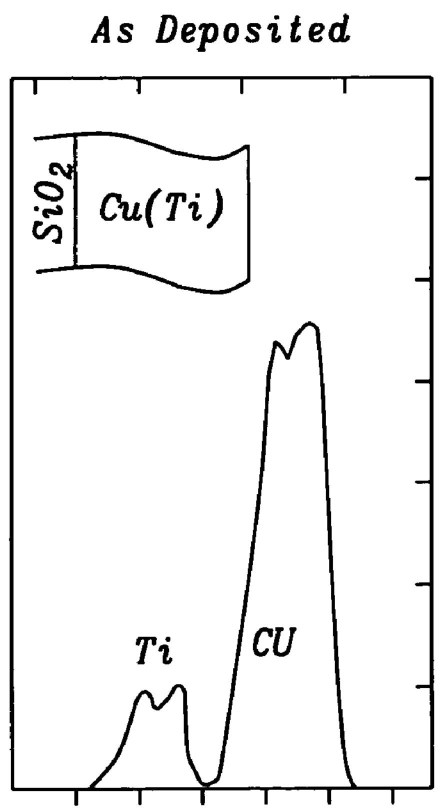
FIG. 5 is a backscattering spectra for a copper-titanium sample layer as deposited, and following an annealing step for the copper-titanium layer as deposited.
Figure 6:
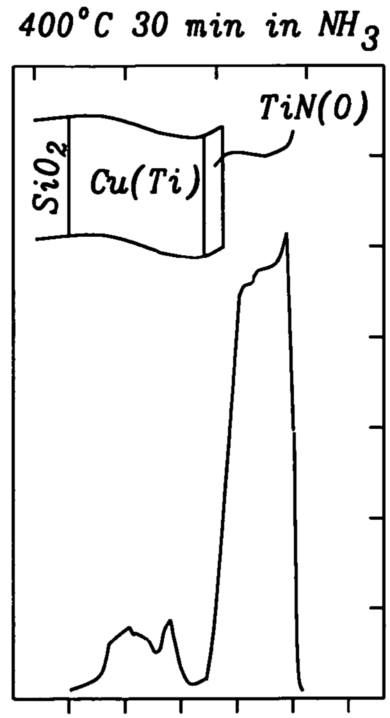
FIG. 6 is a backscattering spectra for a copper-titanium sample layer as deposited, and following an annealing step.
Figure 7:
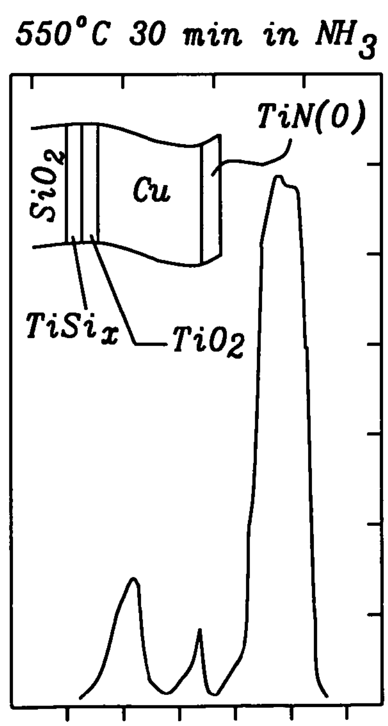
FIG. 7 is backscattering spectra for a copper-titanium sample layer as deposited, and following an annealing step.

Copper-titanium samples were prepared and annealed in $NH_3$ for 30 minutes at temperatures of about 400° C. and 550° C. FIG. 5 shows a back-scattering spectra for the copper-titanium layer as deposited. FIG. 6 shows a back-scattering spectra for the copper-titanium layer after a 30 minute anneal in $NH_3$ at a temperature of about 400° C. An oxygen rich TiN top layer (e.g., TiON) is formed, and the copper-titanium layer is essentially oxygen-free. FIG. 7 shows a back-scattering spectra following annealing of a copper-titanium layer in $NH_3$ for 30 minutes at a temperature of about 550° C. An oxygen rich TiN top layer is formed over a copper layer which is essentially oxygen-free and titanium-free.

ADVANTAGES OF EMBODIMENTS OF THE INVENTION

The embodiments of the present invention provides considerable improvement over the prior art. One advantage of the present invention is that the self-passivation layer prevents copper diffusion into subsequently formed insulating layers, eliminating the need for a high-K nitride barrier layer. Eliminating the high-K nitride barrier layer reduces RC delay improving device performance. Another advantage is that an inhibitor agent does not need to be added to the CMP slurry. An embodiment of the invention eliminates the need for an inhibitor agent in the CMP slurry between the self-passivation layer can be a anti-corrosion layer. Also, the copper in the damascene structure is prevented from reacting with $NH_3/SiH_4$ during subsequent PECVD processes.

While the invention has been particularly shown and described with reference to the preferred embodiments thereof, it will be understood by those skilled in the art that various changes in form and details may be made without departing from the spirit and scope of the invention.

What is claimed is:

1. An interconnect structure comprising:

an insulating layer over a semiconductor structure having an opening therein;

a barrier layer over said insulating layer conformally within said opening;

a fill layer comprised of Cu and Ti filling said opening in said insulating layer and overlying said barrier layer wherein the fill layer has a Ti concentration ranging between about 0.1 and 2.0 weight %.; and a self-passivation layer comprised titanium nitride over said fill layer.

2. The structure according to claim 1 wherein said insulating layer is comprised of a low-k material.

3. The structure according to claim 1 wherein said self-passivation layer is comprised of oxygen-rich titanium nitride.

4. The structure according to claim 1 wherein said opening is a dual damascene shaped opening.

5. The structure according to claim 1 wherein said barrier layer comprises TaN.

6. The structure according to claim 1 wherein said barrier layer is comprised of tantalum nitride, molybdenum, tungsten, chromium, or vanadium.

7. The structure according to claim 1 wherein said barrier layer has a thickness of between about 50 and 2000 Angstroms.

8. The structure according to claim 1 wherein said Ti is essentially uniformly distributed through said fill layer.

9. An interconnect structure comprising:

an insulating layer over a semiconductor structure having an opening therein;

a fill layer comprised of Cu and Ti filling said opening in said insulating layer; and a self-passivation layer comprised titanium nitride over said fill layer, wherein said fill layer has a Ti concentration ranging between about 0.1 and 2.0 weight %.

10. An interconnect structure comprising;

an insulating layer over a semiconductor structure having an opening therein;

a fill layer comprised of Cu and Ti filling said opening in said insulating layer wherein said Ti concentration ranges between about 0.1 and 2.0 weight %; and a self-passivation layer comprised titanium nitride over said fill layer.

11. The structure according to claim 10 wherein Ti is essentially uniformly distributed through said fill layer.

12. The structure according to claim 10 wherein said insulating layer is comprised of a low-k material.

13. The structure according to claim 10 wherein said opening is a dual damascene shaped opening.

14. The structure according to claim 10 further comprising a barrier layer disposed between the insulating layer and the fill layer.

* * * * *